United States Patent
Krymski et al.

[11] Patent Number: 6,043,690
[45] Date of Patent: Mar. 28, 2000

[54] BIDIRECTIONAL FOLLOWER FOR DRIVING A CAPACITIVE LOAD

[75] Inventors: Alexander Krymski, Montrose; Sandor Barna, Pasadena; Barmak Mansoorian, Los Angeles, all of Calif.

[73] Assignee: Photobit Corporation, Pasadena, Calif.

[21] Appl. No.: 09/038,635

[22] Filed: Mar. 10, 1998

[51] Int. Cl.[7] .................................................. H03K 3/00
[52] U.S. Cl. ............................................. 327/112; 327/333
[58] Field of Search ................................. 327/108, 111, 327/112, 333, 560, 334; 326/83

[56] References Cited

U.S. PATENT DOCUMENTS

| | | | |
|---|---|---|---|
| 4,101,788 | 7/1978 | Baker | 326/83 |
| 4,168,471 | 9/1979 | Sampei | 330/264 |
| 4,347,481 | 8/1982 | Yoshida | 330/251 |
| 4,489,284 | 12/1984 | Charpentier et al. | 327/208 |
| 5,610,550 | 3/1997 | Furutani | 327/543 |
| 5,757,225 | 5/1998 | Tobita | 327/540 |

*Primary Examiner*—Toan Tran
*Attorney, Agent, or Firm*—Fish & Richardson P.C.

[57] ABSTRACT

A bidirectional source follower system includes an N channel transistor and P channel transistor which conduct in opposite ways. The n channel transistor is connected to quickly source current, however is relatively inefficient at sinking current. In contrast, the P channel transistor can sink current very quickly but is bad at source current. The two devices are connected together in a way which allows advantageous features of both.

7 Claims, 2 Drawing Sheets

6,043,690

BIDIRECTIONAL FOLLOWER FOR DRIVING A CAPACITIVE LOAD

BACKGROUND OF THE INVENTION

One stage differential amplifiers are commonly used as buffers. However, such a buffer has a settling time which is slope-limited by the capacitance being driver. A common one of such buffers is a source follower. A typical source follower is shown in FIG. 1. The input signal 100 is applied to the gate 102 of an FET 104. Drain 106 and source 108 are appropriately biased. The source is also connected to a constant current source 112. The signal out 110 drive a capacitive load 114.

This device is capable of quickly charging the capacitor through the FET 104. However, the device only provides quick operation in one direction, herein changing direction. The discharge of the capacitor is provided across the high resistance load of the source follower. The load is usually a current sink, which limits the settling time for the falling edge.

Putting this another way, the settling time is slope limited by the charge of the load capacitance with the amplifier reference current.

It is often desirable to limit the amount of power which is used by the circuit. However, a source follower such as FIG. 1 would require charging a 25 pF capacitance by dv=2 volts for 25 nanoseconds. This would require a current typically higher than 2 milliamps.

A two-stage op amp configured as a unity gain buffer could be used to solve such a problem. However, the circuit can become complicated. Moreover, unless the value of the load capacitance is very accurately known, it becomes difficult to stabilize the op amp using standard compensation capacitor techniques.

SUMMARY OF THE INVENTION

The inventors recognized that it would be desirable to exploit the advantageous properties of NMOS and PMOS source followers. The NMOS source follower pulls in one direction better and thereby allows a better rise characteristic. The PMOS source follower pulls in the other direction better and therefore provides a better fall characteristic. However, it is not a simple matter to simply put together an NMOS and PMOS follower. A simple connection would provide a CMOS inverter with a sharp transition. This would not be usable in such a system.

Therefore, the system of the present invention uses NMOS and PMOS source followers which are connected together in a special way to operate linearly. Another aspect of the invention uses mirrored currents to bias the source followers. Yet another aspect provides asymmetric characteristics to provide a weighted mirroring between bias transistors and actual current conducting transistors.

BRIEF DESCRIPTION OF THE DRAWINGS

These and other aspects will be described with reference to the accompanying drawings wherein.

DESCRIPTION OF THE PREFERRED EMBODIMENT

Figure 2:
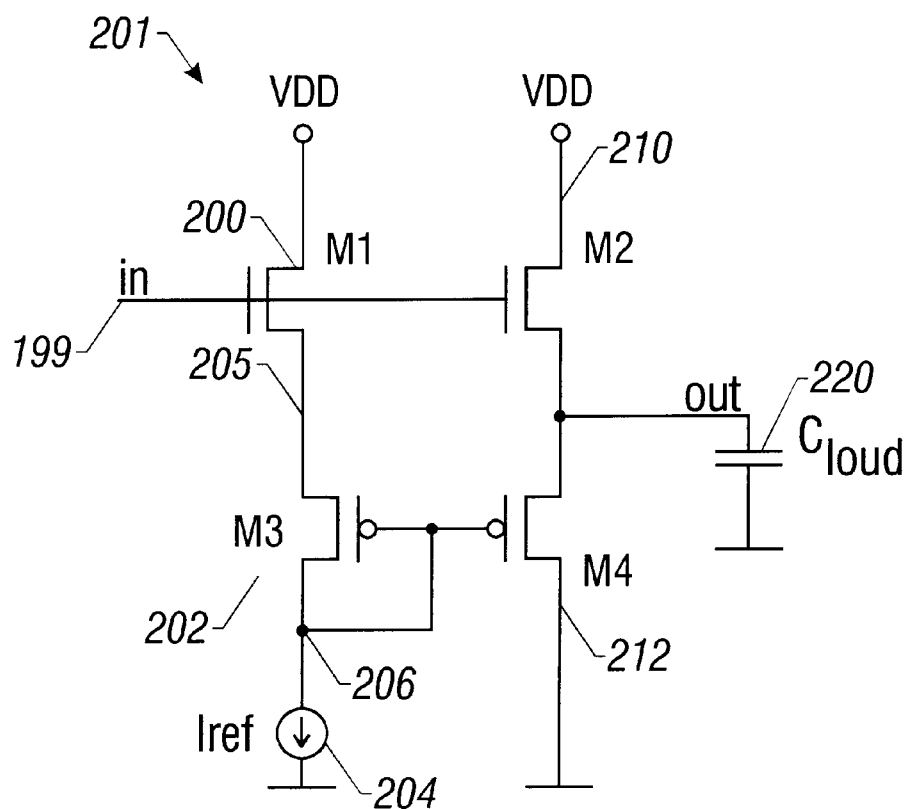
FIG. 2 shows a schematic of a preferred circuit according to the present embodiment.

The preferred circuit is shown in FIG. 2. The circuit includes two sets of source follower pairs working in parallel and mirrored with one another. An NMOS FET 20D and PMOS FET 202 constitute the first source follower pair 201. PMOS FET 202 includes a current reference 204 providing the appropriate current reference. The PMOS 202 is diode connected, causing a biasing on the gate of PMOS 202 which follows its input.

The second source follower pair includes transistors 210 and 212. Transistor 210 is mirrored to transistor 200 and transistor 212 is mirrored to transistor 204.

In operation, the circuit operates as follows. Input signal 199 causes the gate of FETs 200 and 210 to rise. This produces a higher voltage to source 205 of FET 202, which has a constant current on its drain node 206. Since there is a higher voltage on the source 205, the voltage drop across FET 202 needs to change. This effectively changes the voltage drop across FET 202 in a way which increases the bias to the gate of FET 202; also increasing the bias to the gate of FET 212.

The mirrored transistors 210, 212 operate in analogous ways. The rising edge of the input signal 199 also opens transistor 210. This charges the load 220 with a large transient current, limited only by the conduction of FET 210. However, when the signal 199 falls, the first source follower circuit 201 does not see any capacitance as it would if the circuit were a single stage circuit. Hence, the voltage across M1, and hence at the gate of M3, will decrease without capacitive effects. This increases the current sink that can be accepted by PMOS 202 and 212. Therefore, the current from load 220 is quickly sunk through transistor 212.

Figure 1:
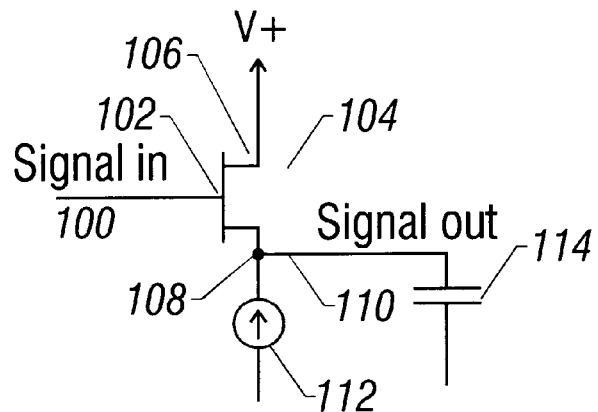
FIG. 1 shows a schematic of a prior art source follower circuit.

One problem with the source follower in FIG. 1 is that the transient current is typically limited to the amount of quiescent current through the current source. In contrast, the system shown in FIG. 2 allows a ratio of transient current to quiescent current of 1–2 orders of magnitude in both directions.

The FIG. 2 system allows current consumption as small as 0.3 milliamps of DC current. This also makes it possible to pass 50 nanosecond analog pulses of 2 volt amplitude into a 25 pF load.

The circuit in FIG. 2 shows the active cascade portion being NMOS transistors 200 and 210. This system is suitable for buffering signals in the upper zone of the voltage range. However, the PMOS version also has source-well interconnected modifications allowing better linearity. This part of the circuit works better in the lower range of input signals.

A PMOS variant is also contemplated with the PMOS's and NMOS's being exchanged. This can reduce the internal capacitance of the first source follower making the buffer even faster. This latter circuit is appropriate when the voltage swing is small, e.g., less than one volt.

Another embodiment also encompassed within the FIG. 2 drawing, scales the channel length of the various transistors. In this embodiment, the width of channel of M4 is scaled to N<>1 times the width of the channel of transistor 202. The width of the channel of M2 is also scaled to N times the width of the channel of transistor 200. This allows more current output from the output transistors 210, 212 which is where we really care about it. This scaled mirror approach allows the biasing transistors M1, M3 to carry the bias while the output transistors M2, M4 reduce the output signal.

Figure 3:
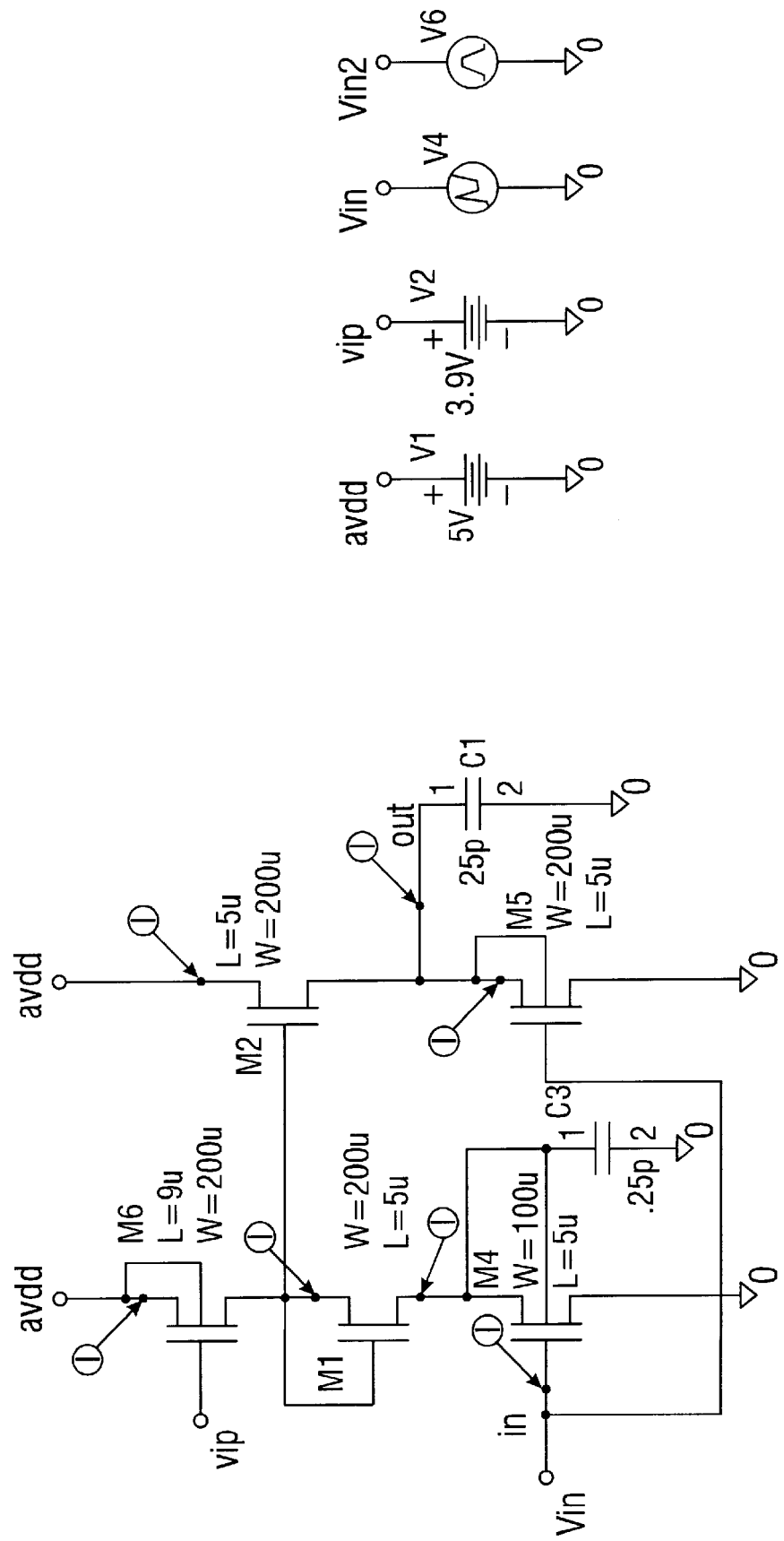
FIG. 3 shows a more detailed layout of the circuit of FIG. 2.

FIG. 3 shows the connections with the PMC)S circuit.

Other modifications are within the disclosed embodiment.

What is claimed is:

1. A source follower buffer circuit comprising:

a first source follower circuit part including a first transistor and a second transistor, said first transistor receiving an input signal, and said second transistor producing a biasing signal based on said input signal; and a second source follower circuit part, producing an output signal, and including a third transistor having a first conductivity type and receiving said input signal, said third transistor connected to source current to a capacitive load when said input signal is increased, and a fourth transistor having a conductivity type opposite to said first conductivity type and connected to sink current from said capacitive load, one of said first and second transistors operating to set a bias level of said fourth transistor, wherein said first source follower circuit part is not affected by said capacitive load.

2. A circuit as in claim 1 wherein said first source follower circuit part includes a P channel transistor and an N channel transistor, and said second source follower circuit part also includes a P channel transistor and an N channel transistor.

3. A circuit as in claim 1 further comprising a current reference, connected to said first source follower circuit part.

4. A circuit as in claim 2 wherein said N channel transistors are the same size and said P channel transistors are the same size.

5. The circuit as in claim 2 wherein the transistors in said second source follower circuit part are scaled to be larger than corresponding transistors in said first source follower circuit part.

6. A source follower circuit, comprising:

a first output transistor, having a first conductivity type and receiving an input signal, said first output transistor connected to source current to a capacitive load when an input signal is increased, said first output transistor operating in an active region;

a second output transistor, having a second conductivity type opposite to said first conductivity type and connected to sink current from said capacitive load, said second output transistor operating in its active region;

a bias transistor, connected to one of said first and second output transistors, and operating to provide a bias level of said one transistor;

an input transistor receiving said input signal, said input transistor operatively connected to said bias transistor to allow current from said capacitive load to quickly sink through said second output transistor.

7. The circuit as in claim 6 wherein said bias transistor is a diode connected transistor.

* * * * *

UNITED STATES PATENT AND TRADEMARK OFFICE
CERTIFICATE OF CORRECTION

PATENT NO. : 6,043,690
DATED : March 28, 2000
INVENTOR(S) : Alexander I. Krymski, et al.

It is certified that error appears in the above-identified patent and that said Letters Patent is hereby corrected as shown below:

<u>In the Drawings</u>:

In the figure on the first page of the patent, correct "loud" to read --load--.
In FIG. 1, correct the directional arrow 112 so that it points down instead of up.
In FIG. 2, correct "loud" to read --load--.

Column 2, line 65, correct "PMC)S" to read --PMOS--.

Signed and Sealed this

Seventeenth Day of April, 2001

Attest:

NICHOLAS P. GODICI

*Attesting Officer*   *Acting Director of the United States Patent and Trademark Office*